United States Patent
Tabersky et al.

(10) Patent No.: US 8,702,912 B2
(45) Date of Patent: Apr. 22, 2014

(54) COATING PROCESS, WORKPIECE OR TOOL AND ITS USE

(75) Inventors: Ralf Tabersky, Bottrop (DE); Mirjam Arndt, Langenfeld (DE)

(73) Assignee: Kennametal Inc., Latrobe, PA (US)

( * ) Notice: Subject to any disclaimer, the term of this patent is extended or adjusted under 35 U.S.C. 154(b) by 625 days.

(21) Appl. No.: 12/866,276

(22) PCT Filed: Apr. 7, 2009

(86) PCT No.: PCT/EP2009/002537
§ 371 (c)(1),
(2), (4) Date: Oct. 1, 2010

(87) PCT Pub. No.: WO2009/127344
PCT Pub. Date: Oct. 22, 2009

(65) Prior Publication Data
US 2011/0020079 A1    Jan. 27, 2011

(30) Foreign Application Priority Data
Apr. 17, 2008 (DE) .......................... 10 2008 019 202

(51) Int. Cl.
*C23C 14/00* (2006.01)

(52) U.S. Cl.
USPC ............... 204/192.1; 204/192.15; 204/192.16

(58) Field of Classification Search
USPC ............ 51/307, 309; 428/336, 697, 698, 699; 204/192, 192.1, 192.15, 192.16
See application file for complete search history.

(56) References Cited

U.S. PATENT DOCUMENTS

| | | | | |
|---|---|---|---|---|
| 6,071,560 A | * | 6/2000 | Braendle et al. | 204/192.38 |
| 6,274,249 B1 | | 8/2001 | Braendle | |
| 7,524,569 B2 | * | 4/2009 | Okamura et al. | 428/699 |
| 8,277,958 B2 | * | 10/2012 | Ni et al. | 428/697 |

FOREIGN PATENT DOCUMENTS

| | | |
|---|---|---|
| CN | 1276025 A | 12/2000 |
| CN | 1811010 A | 8/2006 |
| CN | 1823178 A | 8/2006 |
| DE | 4007523   * | 9/1991 |

(Continued)

OTHER PUBLICATIONS

Adibi et al "Effects of high-flux low-energy (20-100 ev) ion irradiation during depostion on microstructure and preferred orientation of Ti(0.5)Al(0.5)N alloys grown by ultra-high-vacuum reactive magntron sputtering" J.Appl.Phys 73 (12) Jun. 1993 p. 8580-8589.*

(Continued)

*Primary Examiner* — Archene Turner
(74) *Attorney, Agent, or Firm* — Matthew W. Gordon, Esq.

(57) ABSTRACT

The invention relates to a process for coating a substrate composed of cemented carbide, a cermet, steel or ceramic with at least one $Ti_{1-x}Al_xN$ layer by means of a DC sputtering process. The invention further relates to a workpiece or tool which has been coated by the above-described process and to the use thereof. It is an object of the present invention to provide a process by means of which it is possible to produce coatings which combine the advantages of the sputtering process and the arc process, i.e. to make it possible to obtain a coating which has a low roughness and an advantageous (200) texture. A further object of the present invention is to provide a workpiece which has a coating having the properties mentioned. A further object of the present invention is to use tools which are particularly suitable for machining metals. The object achieved by the process is distinguished by ionization aids being used for increasing the plasma densities.

20 Claims, 3 Drawing Sheets

(56) References Cited

FOREIGN PATENT DOCUMENTS

| | | | |
|---|---|---|---|
| JP | 06192834 A | | 7/1994 |
| JP | 08209335 A | | 8/1996 |
| JP | 09-323205 | * | 12/1997 |
| JP | 11-131215 | * | 5/1999 |
| JP | 2001-516654 | * | 10/2001 |
| JP | 2002-003284 | * | 1/2002 |

OTHER PUBLICATIONS

Gordo, P. R. et al., Cylindrical hollow magnetron cathode. Al—N selective coatings for solar collector absorbers., Vacuum, 2 O O 2, vol. 64, p. 315-319, 2002, 315-319.

Ihsan, M. et al., Effect of deposition parameters on properties of films deposited on fibers by hollow cathode magnetron sputtering., Journal of Vacuum Science & Technology. A. Vacuum, Surfaces and Films, 1 9 9 O, vol. 8, No. 3, p. 1304-1312, 1990, 1304-1312.

* cited by examiner

COATING PROCESS, WORKPIECE OR TOOL AND ITS USE

CROSS REFERENCE TO RELATED APPLICATIONS

This application is the US national phase of PCT application PCT/EP2009/002537, filed 7 Apr. 2009, published 22 Oct. 2009 as 2009/127344, and claiming the priority of German patent application 2008019202.3 itself filed 17 Apr. 2008, whose entire disclosures are herewith incorporated by reference.

The invention relates to a process for coating a substrate composed of cemented carbide, a cermet, steel or ceramic with at least one $Ti_{1-x}Al_xN$ layer by means of a DC sputtering process. The invention further relates to a workpiece or tool which has been coated by the above-described process and to the use thereof.

Most cemented carbide cutting elements that are currently produced for machining metals are coated in order to make the cutting insert harder and/or more resistant to wear. Hard materials from the system Ti—Al—N—C are chosen for example as the coating. Apart from CVD processes, PVD processes are also used for the coating.

One particular PVD process is that known as arc PVD. With the aid of a trigger, an arc is struck between an anode (for example a chamber wall) and a cathode, which consists of the (metallic) coating material. This produces such a high temperature at the cathode that the material locally melts and vaporizes. The arc thereby moves across the cathode. In the arc, the vaporized particles are almost completely ionized. By means of the arc-PVD process, it is possible for example to produce TiAlN layers, which have an advantageous (200) texture.

Another PVD process for vaporizing the coating material, as generally described for example in DE 10 2005 021 927 A1, is that known as sputtering (cathode sputtering). In this case, a target consisting of the coating material is bombarded with high-energy ions, so that atoms are detached from the solid body and go over into the vapor phase. By means of sputtering, outstanding surface qualities can be produced, in particular surfaces with low roughness.

One particular sputtering process is high-power impulse-magnetron sputtering (HIPIMS), which is distinguished by the electrical power being supplied in a pulsed manner to the target acting as a cathode (cf. in this respect DE 10 2006 017 382 A1, U.S. Pat. No. 6,296,742). The power density supplied in this case is so great that the glow discharge occurring already has characteristics of an arc discharge. In the case of HIPIMS, very high voltages are used. Since the target is used as the cathode, this process involves an increased resputtering effect, which leads to a low deposition rate. This is accompanied by the growth rate being comparatively is low.

In EP 10 17870 B1, a tool with a protective layer system is disclosed. The tool has an MeX coating, where Me comprises titanium and aluminum and X is at least one of nitrogen or carbon. The ratio $Q_1$ of the diffraction intensities of the (200) plane to the (111) plane is greater than 1. For the compressive stress σ within the layer, 1 GPa≤σ≤6 GPa. An arc vapor deposition or vapor deposition by means of reactive sputtering is chosen as the coating process.

It is an object of the present invention to provide a process by means of which it is possible to produce coatings which combine the advantages of the sputtering process and the arc process, i.e. to make it possible to obtain a coating which has a low roughness and an advantageous (200) texture.

A further object of the present invention is to provide a workpiece which has a coating having the properties mentioned.

A further object of the present invention is to use tools which are particularly suitable for machining metals.

These objects are achieved by the process as claimed in claim 1, by the hard-material-coated workpiece as claimed in claim 6 and by the use thereof as claimed in claim 9.

In the case of the process as claimed in claim 1, ionization aids are used for increasing the plasma densities.

An advantageous embodiment of the process according to the invention provides that the plasma density is increased by means of the hollow cathode effect. The hollow cathode effect can be observed under certain preconditions during a glow discharge. During the glow discharge, zones which are referred to as a cathode drop or glow seam form on the surface of the cathodes. If the adjacent cathode surfaces are brought so close together that these zones overlap, the quasi neutrality of the plasma is overcome and great ionization of the gases flowing past these surfaces occurs. According to a further refinement of the invention, all the reaction gases are made to pass through a hollow cathode. Preferably, in the case of the DC sputtering process according to the invention, the hollow cathode discharge is operated permanently.

Another advantageous refinement of the process is that magnetic fields are used for increasing the plasma density, the magnetic field lines preferably being perpendicular to the substrate surface that is to be coated. The Lorentz force acts perpendicularly to the direction of movement on electrically charged particles that are moving at a speed v in relation to a magnetic field. In the case of a homogeneous magnetic field, the particles move on circular paths, whereby the plasma density increases.

An advantageous refinement of the workpiece that is produced by the process as claimed in claim 1 is that, in the $T_{1-x}Al_xN$ layer, 0.5≤x≤0.7 applies for x.

A further advantageous refinement is that the thickness of the $Ti_{1-x}Al_xN$ layer is at most 15 μm, preferably at most 10 μm.

Workpieces as claimed in claim 4 that are produced by the process as claimed in claim 1 are particularly well suited for the production of machining, forming or punching tools, preferably indexable inserts, shank-type tools, in particular drills or mills, or wearing components.

Advantageous refinements of the process according to the invention are explained below with reference to the figures, in which:

FIGS. 1a and b show the occurrence of the hollow cathode effect,

Figure 1A:
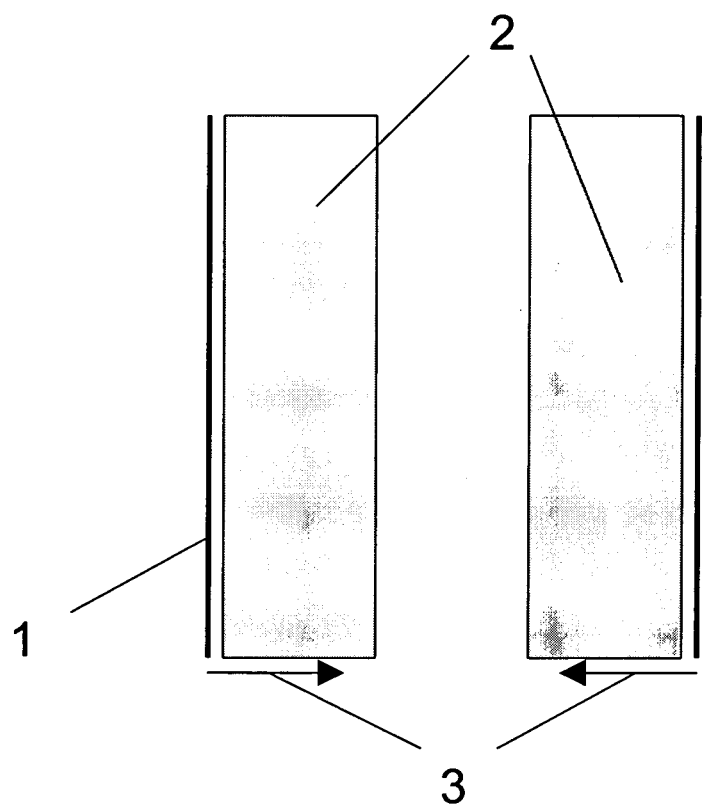
FIG. 1c shows the stream of gas through the hollow cathode.
Figure 1B:
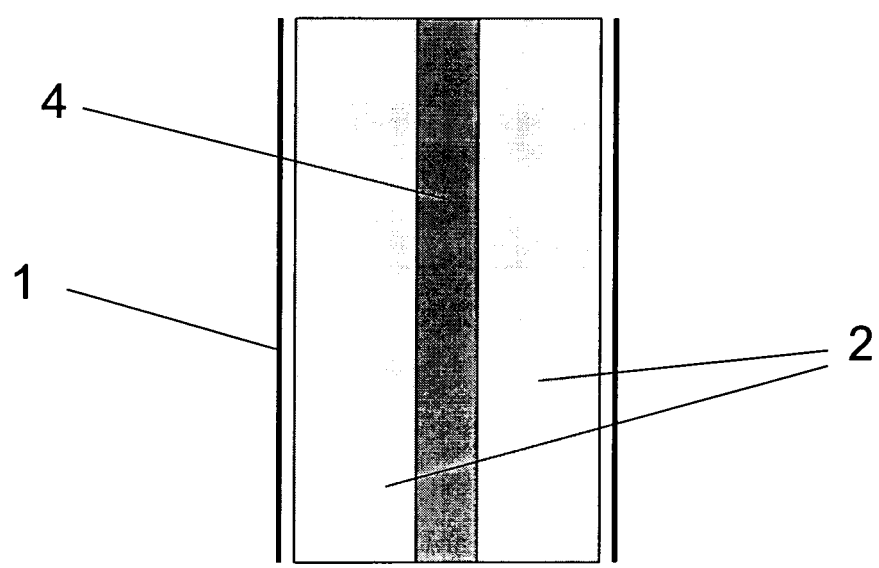
Figure 1C:
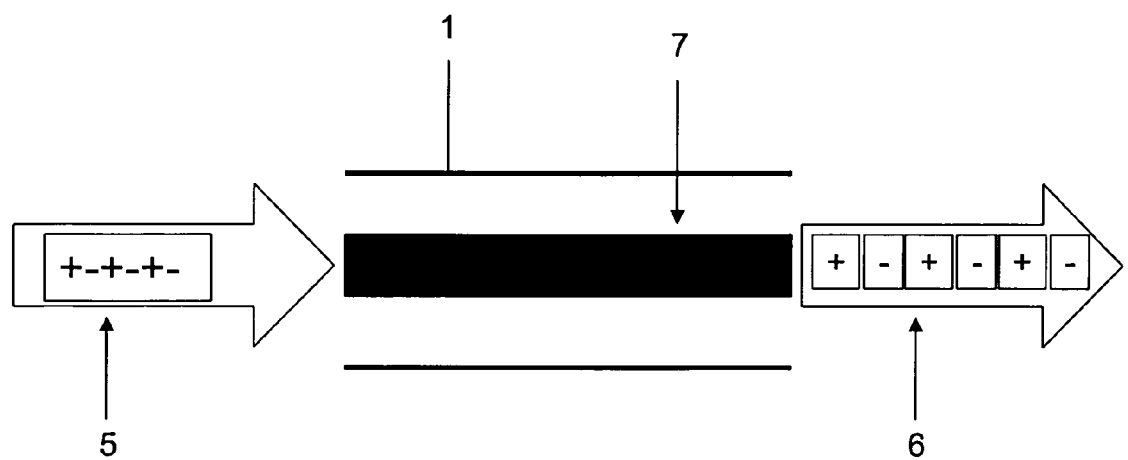

During a glow discharge, a cathode drop or a glow seam 2 occurs at the cathode 1. If the cathodes 1 are moved toward each other to a sufficient extent in the direction of the arrow 3, this produces a zone 4 in which the glow seams overlap. In this region, the quasi neutrality of the plasma is overcome. If a neutral gas 5 is passed through the zone 4, the stream of gas 7 is ionized and the plasma 6 is produced.

Figure 2:
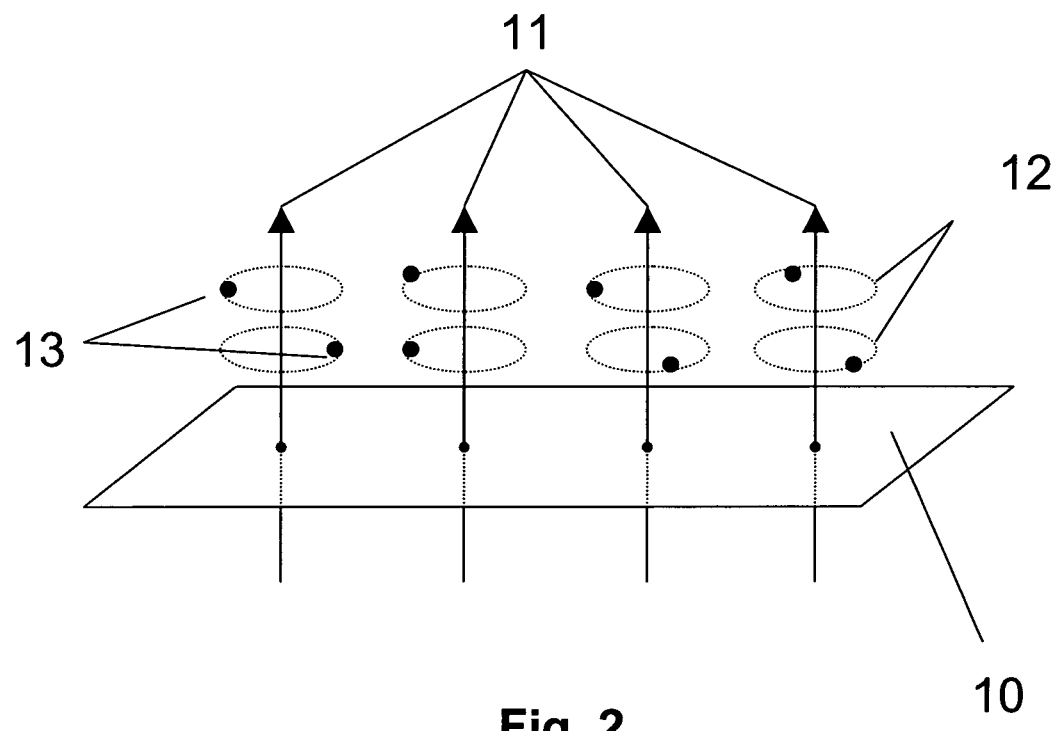
FIG. 2 shows the increase in the plasma density brought about by additional magnetic fields.

Another possibility for increasing the plasma density is represented in FIG. 2. The substrate 10 to be coated is penetrated by the perpendicularly arranged magnetic field with the magnetic field lines 11. Electrically charged particles 13 are forced onto circular paths 12 as a result of the Lorentz force acting, whereby the plasma density increases.

With the process according to the invention and with cutting inserts coated by the process according to the invention it has been possible to determine the following advantages in comparative tests.

EXAMPLE 1

Corner milling (single-tooth test) of 42Cr Mo 4V
Type of milling tool: M680 D63 Z1
Form of indexable insert: XPHT160412
Cutting speed Vc=220 m/min
Feed per tooth fz=0.25 mm
Cutting depth ap=2.5 mm
Contact width ae=38 mm
The standard coating with a texture coefficient of $Q_f=0.4$ achieved a tool life travel of 4000 mm. By contrast, an embodiment according to the invention with a texture coefficient of $Q_f=1.8$ and an internal compressive stress of $-1.6$ GPa achieved a tool life travel of 7000 mm.

EXAMPLE 2

Corner milling (single-tooth test) of X 5CrNi 18-10
Type of milling tool: M680 D63 Z1
Form of indexable insert: XPHT160412
Angle of adjustment: 90°
Cutting speed Vc=100 m/min
Feed per tooth fz=0.11 mm
Cutting depth ap=2.5 mm
Contact width ae=35 mm
The standard coating with a texture coefficient of $Q_f=0.8$ achieved a tool life travel of 1700 mm. With a coating according to the invention, which has a texture coefficient $Q_f=2.67$ and an internal compressive stress of $-1.8$ GPa, a tool life travel of 2800 mm was achieved.

EXAMPLE 3

Corner milling (single-tooth test) of X 5CrNi 18-10
Type of milling tool: M680 D80 Z1
Form of indexable insert: XPHT160412
Angle of adjustment: 90°
Cutting speed Vc=250 m/min
Feed per tooth fz=0.15 mm
Cutting depth ap=2.5 mm
Contact width ae=24 mm
The standard coating with a texture coefficient of $Q_f=0.6$ achieved a tool life travel of 2400 mm. An embodiment according to the invention with a texture coefficient $Q_f=2.5$ and an internal compressive stress of $-1.6$ GPa achieved a tool life travel of 3600 mm.

EXAMPLE 4

Corner milling (single-tooth test) of CK 45
Type of milling tool: M680 D80 Z1
Form of indexable insert: XPHT160412
Angle of adjustment: 90°
Cutting speed Vc=280 m/min
Feed per tooth fz=0.25 mm
Cutting depth ap=2.5 mm
Contact width ae=44 mm
The standard coating with a texture coefficient of $Q_f=0.6$ achieved a tool life travel of 5400 mm. An embodiment according to the invention with a texture coefficient $Q_f=2.5$ and an internal compressive stress of $-1.5$ GPa achieved a tool life travel of 7400 mm.

The invention claimed is:

1. A process for coating a substrate composed of cemented carbide, a cermet, steel or ceramic with at least one $Ti_{1-x}Al_xN$ layer by means of a DC sputtering process employing a hollow cathode having open ends, wherein plasma density is increased by means of the hollow cathode effect.

2. The process as claimed in claim 1, wherein all reaction gases are made to pass through the hollow cathode.

3. The process as claimed in claim 1 wherein a DC sputtering process is used in which the hollow cathode discharge is operated permanently.

4. The process of claim 1, wherein the at least one $Ti_{1-x}Al_xN$ layer has a $Q_1$ quotient>1, where $Q_1$ is the ratio of the diffraction intensities of I (200) to I (111) respectively attributable to the (200) lattice planes and the (111) lattice planes in the X-ray diffraction of the material using the σ-2θ method.

5. The process of claim 1, wherein the at least one $Ti_{1-x}Al_xN$ layer has an internal compressive stress of $-1$ GPa to $-2$ GPa.

6. The process of claim 1, wherein 0.5<x<0.7 for the at least one $Ti_{1-x}Al_xN$ layer.

7. The process of claim 1, wherein the coating has a thickness of at most 15 μm.

8. The process of claim 1, wherein the substrate is a machining, forming or punching tool, shank-type tool or wearing component.

9. The process of claim 1, wherein the substrate is an indexable insert.

10. The process of claim 1, wherein the substrate is a drill or mill.

11. The process of claim 1, wherein cathodes producing the hollow cathode effect are formed of a titanium and aluminum alloy.

12. A process for coating a substrate composed of a cemented carbide, a cermet, steel or ceramic with at least one $Ti_{1-x}Al_xN$ layer by means of a DC sputtering process, wherein magnetic field lines are used for increasing the plasma density, the magnetic field lines being perpendicular to the substrate surface that is to be coated.

13. The process of claim 12, wherein the at least one $Ti_{1-x}Al_xN$ layer has a $Q_1$ quotient>1, where $Q_1$ is the ratio of the diffraction intensities of I (200) to I (111) respectively attributable to the (200) lattice planes and the (111) lattice planes in the X-ray diffraction of the material using the σ-2θ method.

14. The process of claim 12, wherein the at least one $Ti_{1-x}Al_xN$ layer has an internal compressive stress of $-1$ GPa to $-2$ GPa.

15. The process of claim 12, wherein 0.5<x<0.7 for the at least one $Ti_{1-x}Al_xN$ layer.

16. The process of claim 12, wherein the coating has a thickness of at most 15 μm.

17. The process of claim 12, wherein the substrate is a machining, forming or punching tool, shank-type tool or wearing component.

18. The process of claim 12, wherein the substrate is an indexable insert.

19. The process of claim 12, wherein the substrate is a drill or mill.

20. The process of claim 12, wherein cathodes producing the hollow cathode effect are formed of a titanium and aluminum alloy.

* * * * *